US011655555B2

United States Patent
Sung et al.

(10) Patent No.: US 11,655,555 B2
(45) Date of Patent: May 23, 2023

(54) ADVANCED REVERSE TREATED ELECTRODEPOSITED COPPER FOIL AND COPPER CLAD LAMINATE USING THE SAME

(71) Applicant: CO-TECH DEVELOPMENT CORP., Yun Lin (TW)

(72) Inventors: Yun-Hsing Sung, Taoyuan (TW); Shih-Shen Lee, New Taipei (TW); Hung-Wei Hsu, Yun Lin (TW); Chun-Yu Kao, Yunlin County (TW)

(73) Assignee: CO-TECH DEVELOPMENT CORP., Yun Lin (TW)

( * ) Notice: Subject to any disclaimer, the term of this patent is extended or adjusted under 35 U.S.C. 154(b) by 438 days.

(21) Appl. No.: 16/899,585

(22) Filed: Jun. 12, 2020

(65) Prior Publication Data

US 2020/0392640 A1    Dec. 17, 2020

Related U.S. Application Data

(60) Provisional application No. 62/860,766, filed on Jun. 12, 2019.

(51) Int. Cl.

| | | |
|---|---|---|
| *C23D 15/00* | (2006.01) | |
| *C25D 15/00* | (2006.01) | |
| *C25D 3/38* | (2006.01) | |
| *H05K 1/02* | (2006.01) | |
| *B32B 15/04* | (2006.01) | |

(Continued)

(52) U.S. Cl.
CPC ............. *C25D 15/00* (2013.01); *B32B 15/01* (2013.01); *B32B 15/04* (2013.01); *B32B 15/20* (2013.01); *C25D 3/38* (2013.01); *H05K 1/0237* (2013.01); *H05K 1/09* (2013.01); *B32B 2311/12* (2013.01); *H05K 2201/0355* (2013.01)

(58) Field of Classification Search
None
See application file for complete search history.

(56) References Cited

U.S. PATENT DOCUMENTS

| | | | |
|---|---|---|---|
| 6,291,081 B1 | 9/2001 | Kurabe et al. | |
| 8,252,166 B2 * | 8/2012 | Kobayashi | ........... C25D 7/0614 205/112 |

(Continued)

FOREIGN PATENT DOCUMENTS

| | | |
|---|---|---|
| CN | 105101627 A | 11/2015 |
| CN | 107532322 A | 1/2018 |

(Continued)

OTHER PUBLICATIONS

JX Nippon Mining & Metals Corporation, JPCA Show 2018, 2018, pp. 1-12.

*Primary Examiner* — Daniel J. Schleis
(74) *Attorney, Agent, or Firm* — Li & Cai Intellectual Property Office

(57) ABSTRACT

An advanced reverse treated electrodeposited copper foil and a copper clad laminate using the same are provided. The advanced reverse treated electrodeposited copper foil has an uneven micro-roughened surface. The micro-roughened surface has a plurality of copper crystals, a plurality of copper whiskers and a plurality of copper crystal groups, which are in a non-uniform distribution to form a non-uniformly distributed horizontal or vertical stripe pattern.

19 Claims, 23 Drawing Sheets

Sample 1 SEM X1,000

(51) Int. Cl.
*B32B 15/20* (2006.01)
*B32B 15/01* (2006.01)
*H05K 1/09* (2006.01)

(56) References Cited

U.S. PATENT DOCUMENTS

| | | | | |
|---|---|---|---|---|
| 8,524,378 B2 * | 9/2013 | Arai | ........................ | C25D 5/605 |
| | | | | 428/668 |
| 2012/0111613 A1 * | 5/2012 | Oguro | .................... | C25D 3/562 |
| | | | | 174/257 |

FOREIGN PATENT DOCUMENTS

| | | | |
|---|---|---|---|
| CN | 108697006 A | 10/2018 | |
| EP | 1448036 B1 | 4/2008 | |
| JP | 6237078 A | 8/1994 | |
| JP | 2016188436 A | 11/2016 | |
| TW | 200533261 A | 10/2005 | |
| TW | 201542880 A | 11/2015 | |
| TW | 201833394 A | 9/2018 | |
| TW | 201837243 A | 10/2018 | |
| TW | 201910412 A | 3/2019 | |
| TW | M593711 U | 4/2020 | |
| WO | WO2013047272 A1 | 4/2013 | |
| WO | WO-2015102323 A1 * | 7/2015 | ............... C25D 1/04 |

* cited by examiner

Sample 1 SEM X3,000

Sample 3 SEM X3,000

Sample 3 SEM X5,000

Reverse treated copper foil of C company SEM X1,000

Reverse treated copper foil of F companySEM X1,000

HVLP copper foil of F company SEM X1,000

SEM X1,000

ADVANCED REVERSE TREATED ELECTRODEPOSITED COPPER FOIL AND COPPER CLAD LAMINATE USING THE SAME

CROSS-REFERENCE TO RELATED PATENT APPLICATION

This application claims priority from the U.S. Provisional Patent Application Ser. No. 62/860,766 filed Jun. 12, 2019, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an electrodeposited copper foil and applications thereof, and more particularly to an advanced reverse treated electrodepo sited copper foil formed by a surface treatment and a copper clad laminate using the same. The surface treatment, which is also called an electroplating surface-roughening treatment of a copper foil, uses an electroplating technique to non-uniformly deposit fine granular copper crystals (hereinafter referred to as "copper crystals") on a surface of the copper foil.

BACKGROUND OF THE DISCLOSURE

With the development of information and electronic industries, high-frequency and high-speed signal transmission has become an integral part of modern circuit design and manufacture. In order to meet the high-frequency and high-speed signal transmission requirements of electronic products, the copper foil substrate used needs to have a good insertion loss performance at high frequencies so as to transmit high-frequency signals without excessive loss. The insertion loss of the copper foil substrate is highly correlated with its surface roughness. The copper foil substrate has a good insertion loss performance when the surface roughness is decreased. However, the decrease of the surface roughness may reduce the peel strength between the copper foil and the substrate, thus affecting the defect rate of back-end products. Therefore, how a good insertion loss performance that can be provided while maintaining a peel strength at industry level standards has become a problem to be solved in the related field.

SUMMARY OF THE DISCLOSURE

In response to the above-referenced technical inadequacies, the present disclosure provides an advanced reverse treated electrodeposited copper foil that is adaptable to high frequency and high speed signal transmission and can meet the requirements of 5G applications without compromise of the characteristics required for a target application. For example, the electrodeposited copper foil cannot be reduced in peel strength. The present disclosure further provides a copper clad laminate using the advanced reverse treated electrodeposited copper foil, which can serve as a high frequency and high speed substrate.

In one aspect, the present disclosure provides an advanced reverse treated electrodeposited copper foil that has an uneven micro-roughened surface. The micro-roughened surface has a plurality of non-uniformly distributed copper crystals, in which different numbers of the copper crystals are stacked together to form respective copper whiskers, and different numbers of the copper whiskers are grouped together to form respective copper crystal groups. The copper crystals, the copper whiskers and the copper crystal groups form into a non-uniformly distributed horizontal or vertical stripe pattern that is observed from a scanning electron microscope image of the micro-roughened surface taken with a +35 degree tilt and under 1,000× magnification.

In another aspect, the present disclosure provides a copper clad laminate that includes a substrate and an advanced reverse treated electrodeposited copper foil. The advanced reverse treated electrodeposited copper foil is disposed on the substrate and has an uneven micro-roughened surface that is attached to a surface of the substrate. The micro-roughened surface has a plurality of non-uniformly distributed copper crystals, in which different numbers of the copper crystals are stacked together to form respective copper whiskers, and different numbers of the copper whiskers are grouped together to form respective copper crystal groups. The copper crystals, and the copper whiskers and the copper crystal groups, form into a non-uniformly distributed horizontal or vertical stripe pattern that is observed from a scanning electron microscope image of the micro-roughened surface taken with a +35 degree tilt and under 1,000× magnification. The stripe pattern is similar to a pattern of human hair as shown in FIG. 24.

In certain embodiments, the micro-roughened surface has at least two smooth areas each having a length of 500 nm and a width of 500 nm and at least one rough area having a length of 1,000 nm and a width of 1,000 nm, which are observed from a scanning electron microscope image of the micro-roughened surface taken with a +35 degree tilt and under 10,000× magnification. In each of the smooth areas there are no copper crystals, copper whiskers and/or copper crystal groups, and in the at least one rough area there are at least six of the copper crystals, the copper whiskers and/or the copper crystal groups.

In certain embodiments, each of the copper whiskers has a topmost copper crystal.

In certain embodiments, the topmost copper crystals are each in the shape of a conoid, a rod or a sphere.

In certain embodiments, the number of the topmost copper crystal of the at least one rough area is at least 10% of the total number of the topmost copper crystal, which is observed under 10,000× magnification.

In certain embodiments, a surface roughness Rz (JIS94) of the micro-roughened surface is less than 2.3 µm.

In certain embodiments, the micro-roughened surface includes a plurality of peaks and a plurality of grooves among the peaks, and the copper crystals, the copper whiskers and the copper crystal groups are correspondingly formed on the peaks.

In certain embodiments, each of the grooves has a U-shaped or V-shaped cross-sectional profile.

In conclusion, the advanced reverse treated electrodeposited copper foil of the present disclosure has an apparent uneven surface profile resulted from a plurality of non-uniformly distributed copper crystals, a plurality of copper whiskers respectively formed by different numbers of the copper crystals and a plurality of copper crystal groups respectively formed by different numbers of the copper whiskers. Therefore, the advanced reverse treated electrodeposited copper foil may achieve an increased signal integrity and a reduced insertion loss while maintaining good peel strength, to adapt to high frequency and high speed signal transmission so as to meet the requirements of 5G applications.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
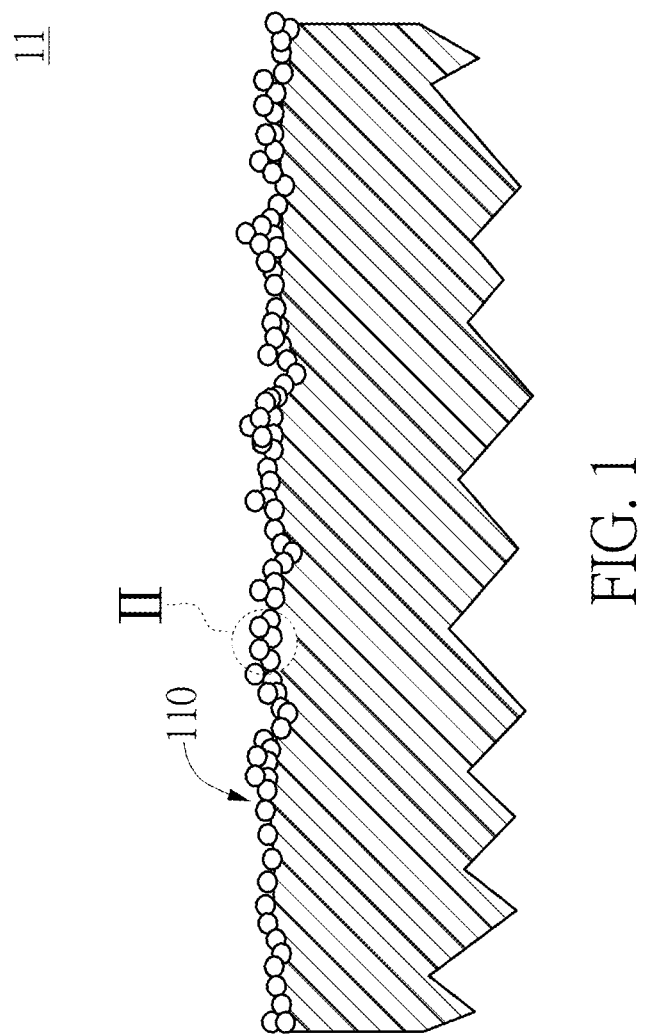
FIG. 1 is a schematic view of an advanced reverse treated electrodeposited copper foil of the present disclosure.

It is generally recognized in the industry that, if a copper foil has a flatter surface profile, a copper clad laminate formed by the copper foil would have better signal integrity but may have a reduced peel strength. That is, when the copper foil has a flatter surface profile, it is difficult to provide a balance between the signal integrity and peel strength of the copper clad laminate. Therefore, the present disclosure provides an advanced reverse treated electrodeposited copper foil having a particular surface profile different from the conventional electrodeposited copper foil. The particular surface profile is capable of increasing signal integrity and reducing signal transmission loss, while not reducing the peel strength of the resulting copper clad laminate.

It is worth mentioning that, the present invention uses a technical solution that is discarded due to the above-mentioned technology prejudice. The technical solution allows a copper foil surface to have a certain degree of unevenness, which directly results in the beneficial technical effect of further optimizing the electrical properties while maintaining good peel strength.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
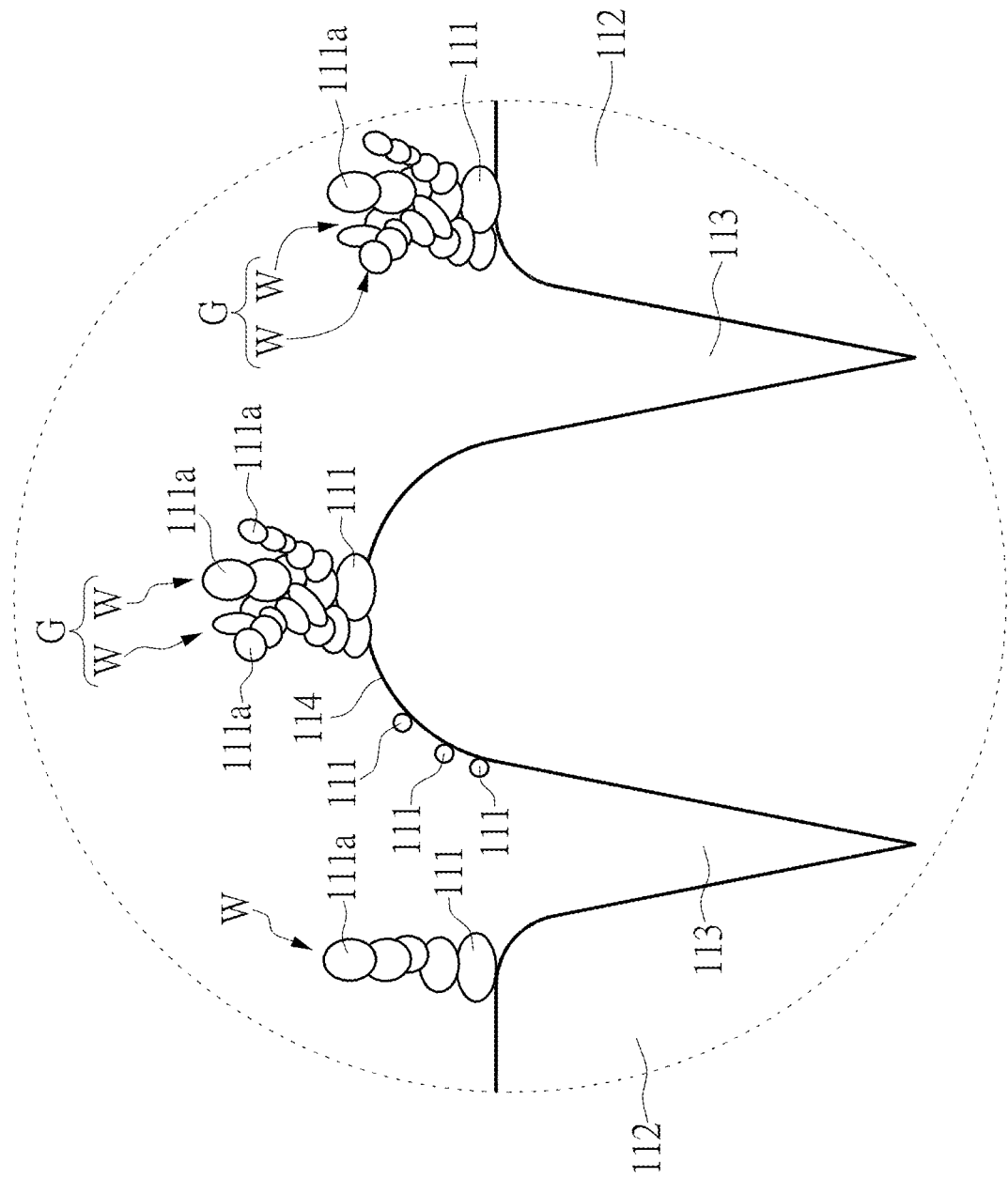
FIG. 2 is an enlarged view of section II of FIG. 1.

Referring to FIG. 1 and FIG. 2, the advanced reverse treated electrodeposited copper foil 11 has an uneven micro-roughened surface 110 that is formed by an electroplating micro-roughening treatment. It is worth mentioning that, the micro-roughened surface 110 has a plurality of copper crystals 111, a plurality of copper whiskers W and a plurality of copper crystal groups G which are in a non-uniform distribution, i.e., are non-uniformly deposited on a copper foil surface. Each of the copper whiskers W is formed by two or more copper crystals 111 stacked together, and different numbers of the copper crystals 111 are stacked together to form respective copper whiskers W. Each of the copper whiskers W has a topmost copper crystal 111 that can be in the shape of a conoid, a rod or a sphere. Each of the copper crystal groups G is formed by two or more copper whiskers W grouped together, and different numbers of the copper whiskers W are grouped together to form respective copper crystal groups G.

In certain embodiments, the average height of the copper whiskers W can be less than 3 µm, preferably less than 1.8 µm, and more preferably less than 1.6 µm. The average height of the copper crystal groups G can be less than 4 µm, preferably less than 3 µm, and more preferably less than 1.6 µm. In certain embodiments, each of the copper whiskers W can include up to fifty copper crystals 111, preferably up to thirty copper crystals 111, more preferably up to fifteen copper crystals 111, and most preferably up to eight copper crystals 111. In certain embodiments, the average outer diameter of the copper crystals 111 can be less than 1 µm, more preferably between 0.5 µm and 1 µm, and most preferably between 0.01 µm and 0.5 µm.

It is worth mentioning that, the advanced reverse treated electrodeposited copper foil 11 of the present disclosure has an apparent uneven surface profile, in which not only are the copper crystals 111 non-uniformly distributed, but also the copper whiskers W are respectively formed by different numbers of the copper crystals 111, and the copper crystal groups G are also respectively formed by different numbers of the copper whiskers W. Therefore, the advanced reverse treated electrodeposited copper foil 11 of the present disclosure is capable of increasing signal integrity and suppressing insertion loss while maintaining good peel strength, so as to adapt to high frequency and high speed signal transmission. In contrast, on a surface of the conventional electrodeposited copper foil, a plurality of copper crystals are uniformly distributed, only a few of which are gathered together. In addition, a surface roughness Rz (JIS94) of the micro-roughened surface 100 is less than 2.3 µm, which can provide a reduction in line width and line spacing.

Figure 5:
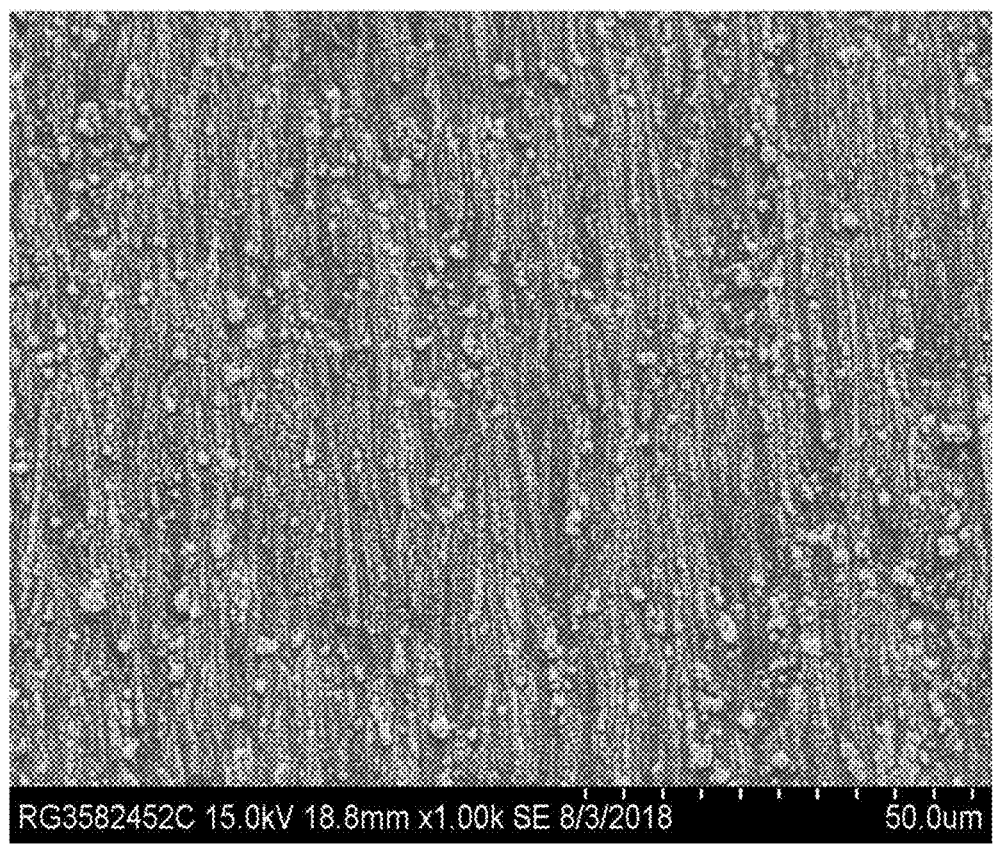
FIG. 5 is a scanning electron microscope image taken with a +35 degree tilt and under 1,000× magnification, which shows a surface profile of the advanced reverse treated electrodeposited copper foil of the present disclosure.
Figure 6:
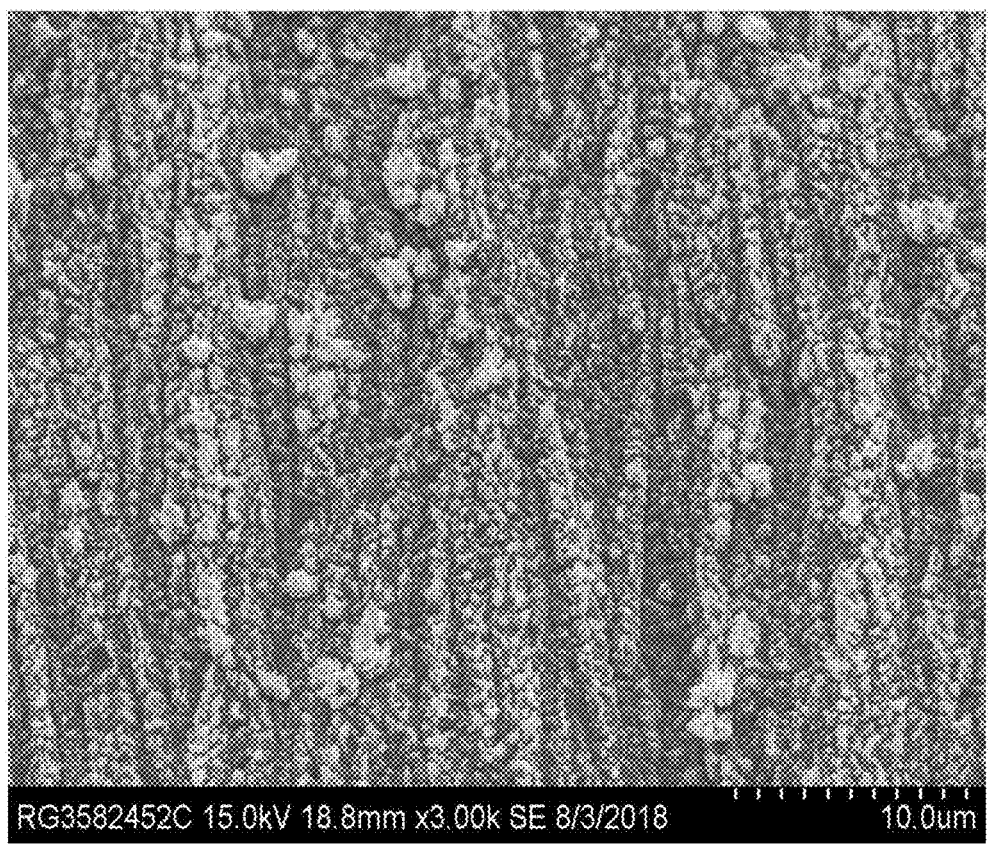
FIG. 6 is a scanning electron microscope image taken with a +35 degree tilt and under 3,000× magnification, which shows the surface profile of the advanced reverse treated electrodeposited copper foil of the present disclosure.
Figure 7:
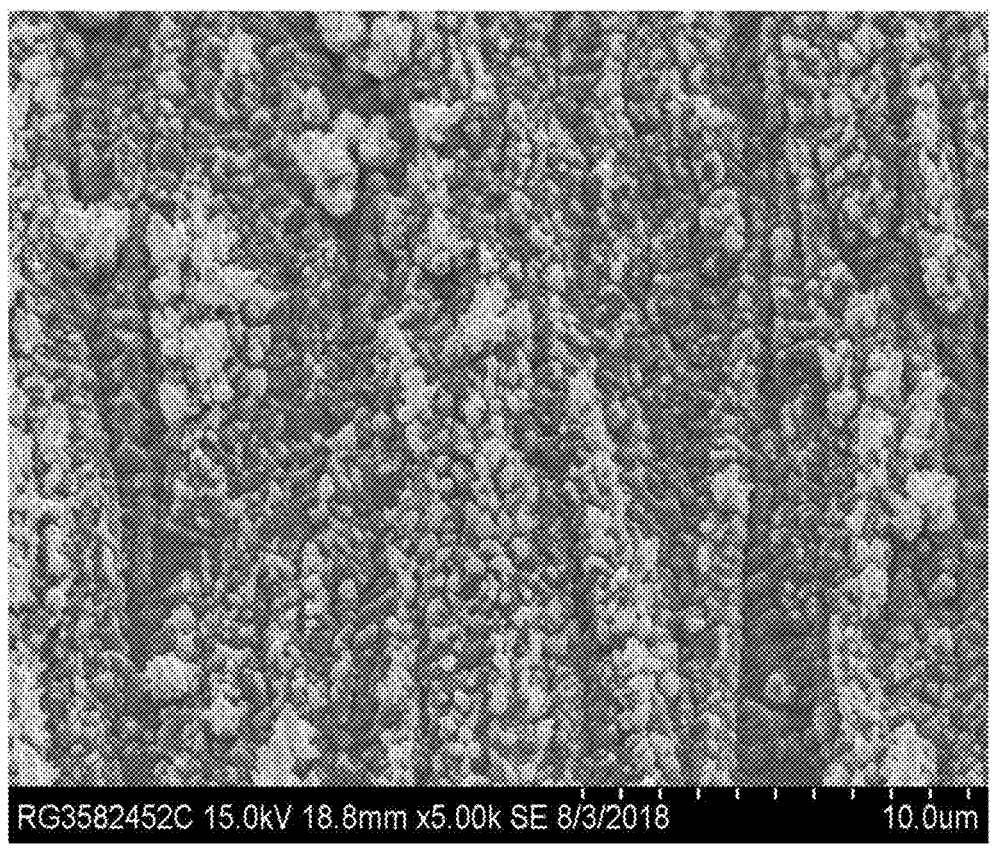
FIG. 7 is a scanning electron microscope image taken with a +35 degree tilt and under 5,000× magnification, which shows a surface profile of the advanced reverse treated electrodeposited copper foil of the present disclosure.
Figure 8:
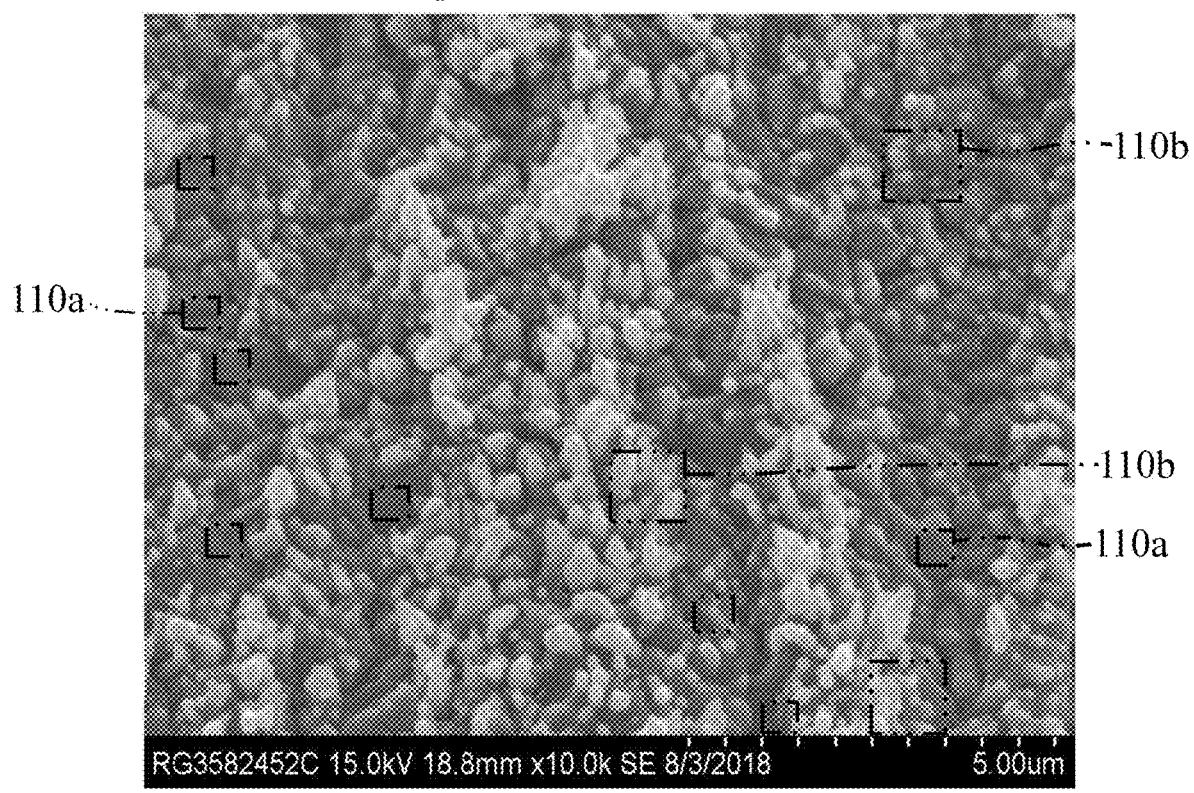
FIG. 8 is a scanning electron microscope image taken with a +35 degree tilt and under 10,000× magnification, which shows a surface profile of the advanced reverse treated electrodeposited copper foil of the present disclosure.
Figure 9:
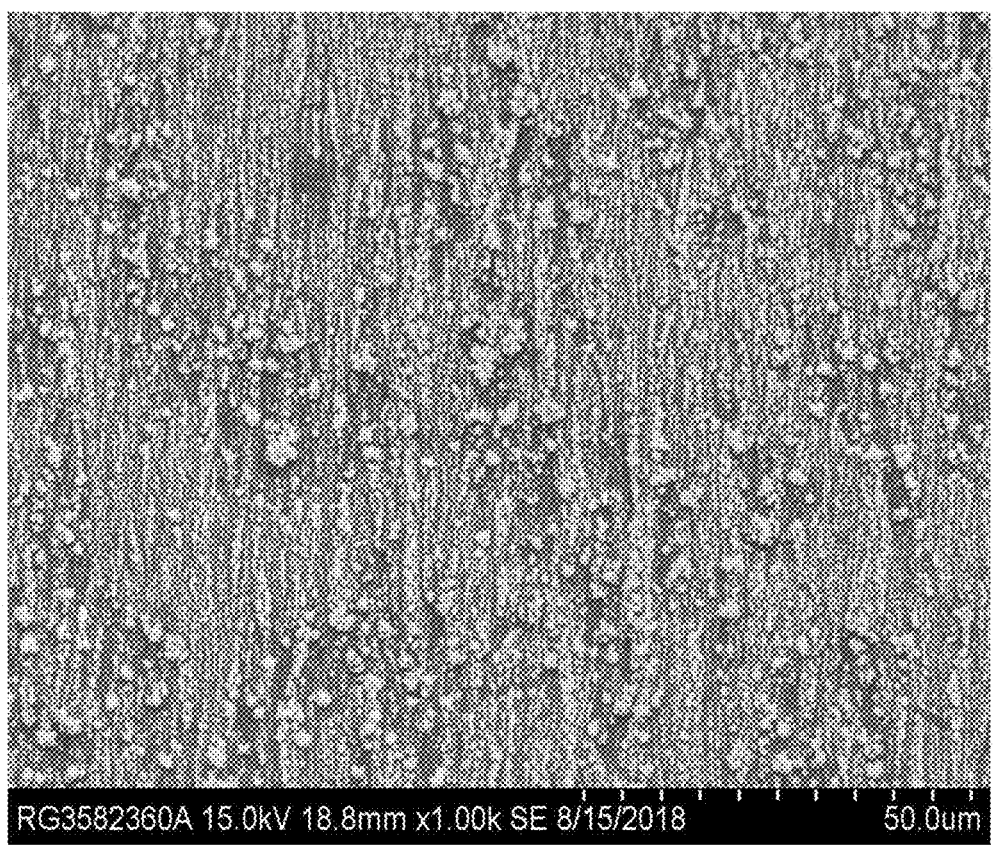
FIG. 9 is a scanning electron microscope image taken with a +35 degree tilt and under 1,000× magnification, which shows another surface profile of the advanced reverse treated electrodeposited copper foil of the present disclosure.
Figure 10:
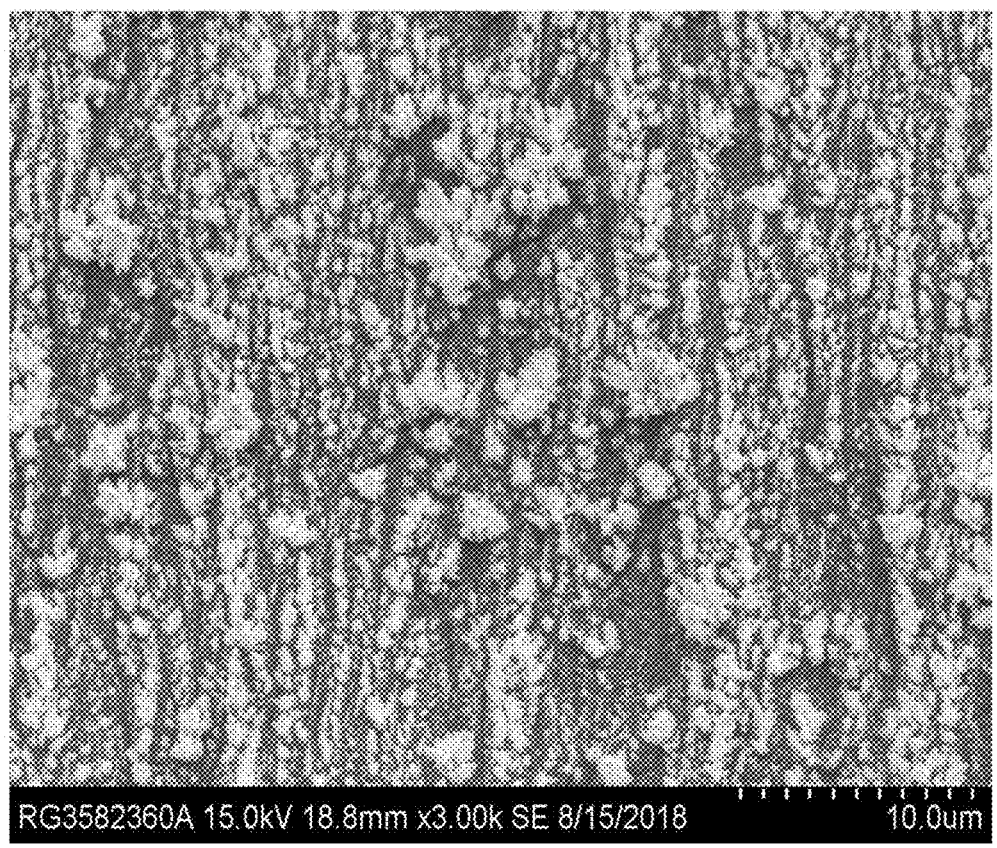
FIG. 10 is a scanning electron microscope image taken with a +35 degree tilt and under 3,000× magnification, which shows another surface profile of the advanced reverse treated electrodeposited copper foil of the present disclosure.
Figure 11:
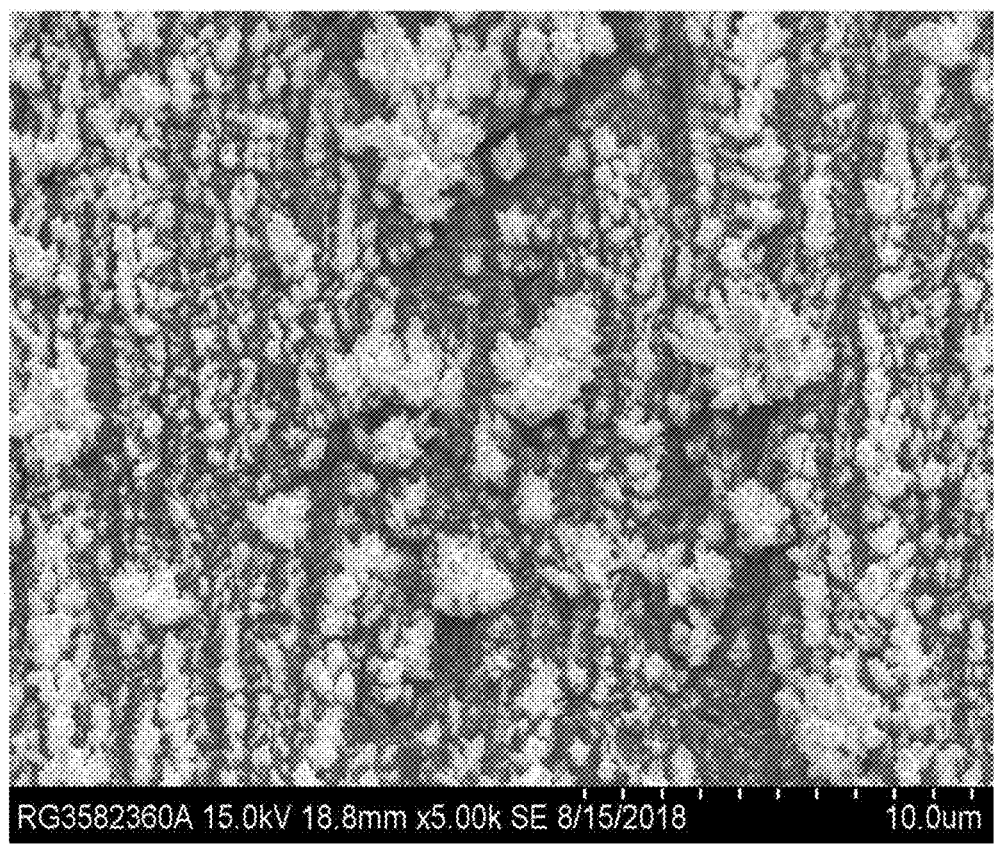
FIG. 11 is a scanning electron microscope image taken with a +35 degree tilt and under 5,000× magnification, which shows another surface profile of the advanced reverse treated electrodeposited copper foil of the present disclosure.
Figure 12:
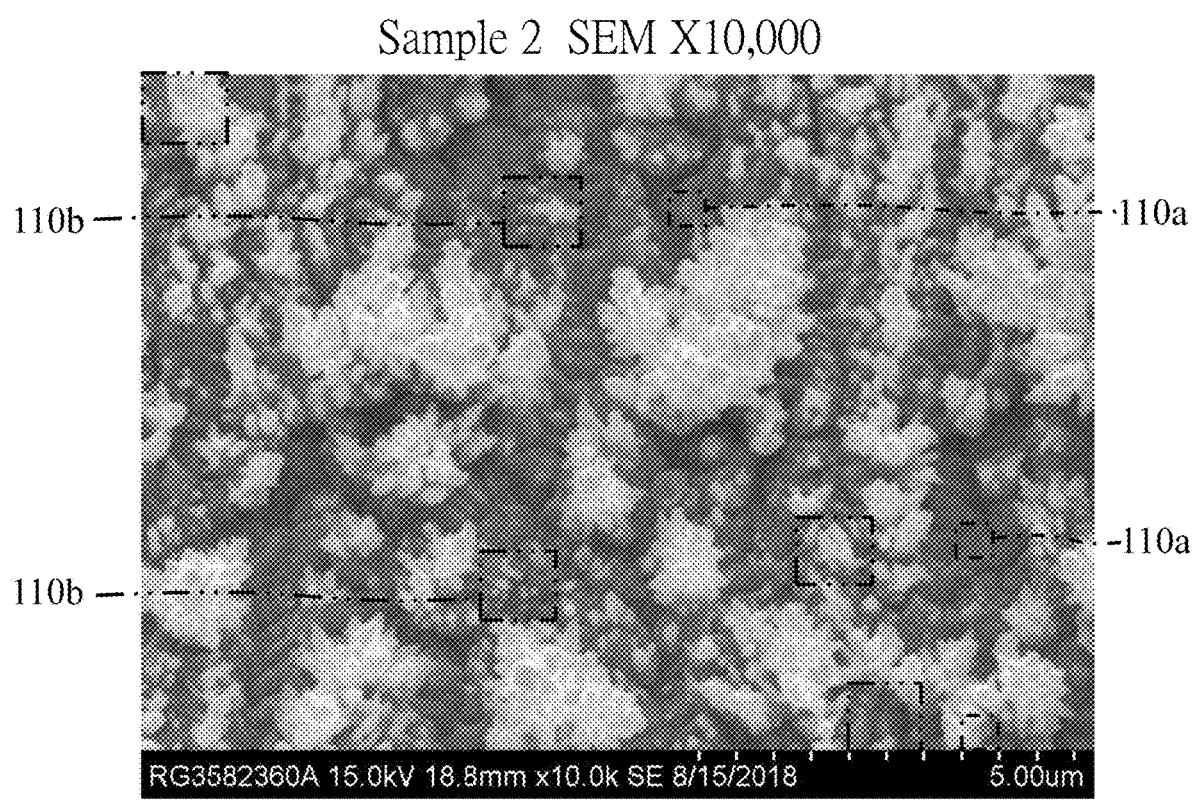
FIG. 12 is a scanning electron microscope image taken with a +35 degree tilt and under 10,000× magnification, which shows another surface profile of the advanced reverse treated electrodeposited copper foil of the present disclosure.
Figure 13:
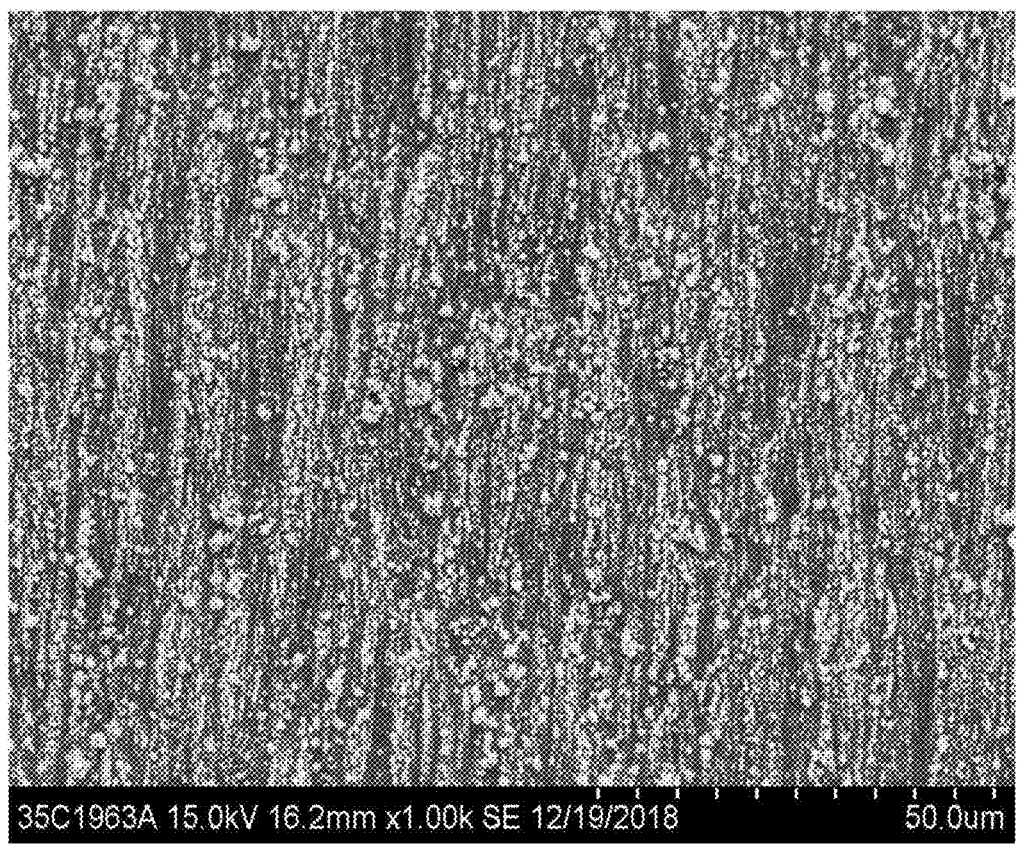
FIG. 13 is a scanning electron microscope image taken with a +35 degree tilt and under 1,000× magnification, which shows still another surface profile of the advanced reverse treated electrodeposited copper foil of the present disclosure.
Figure 14:
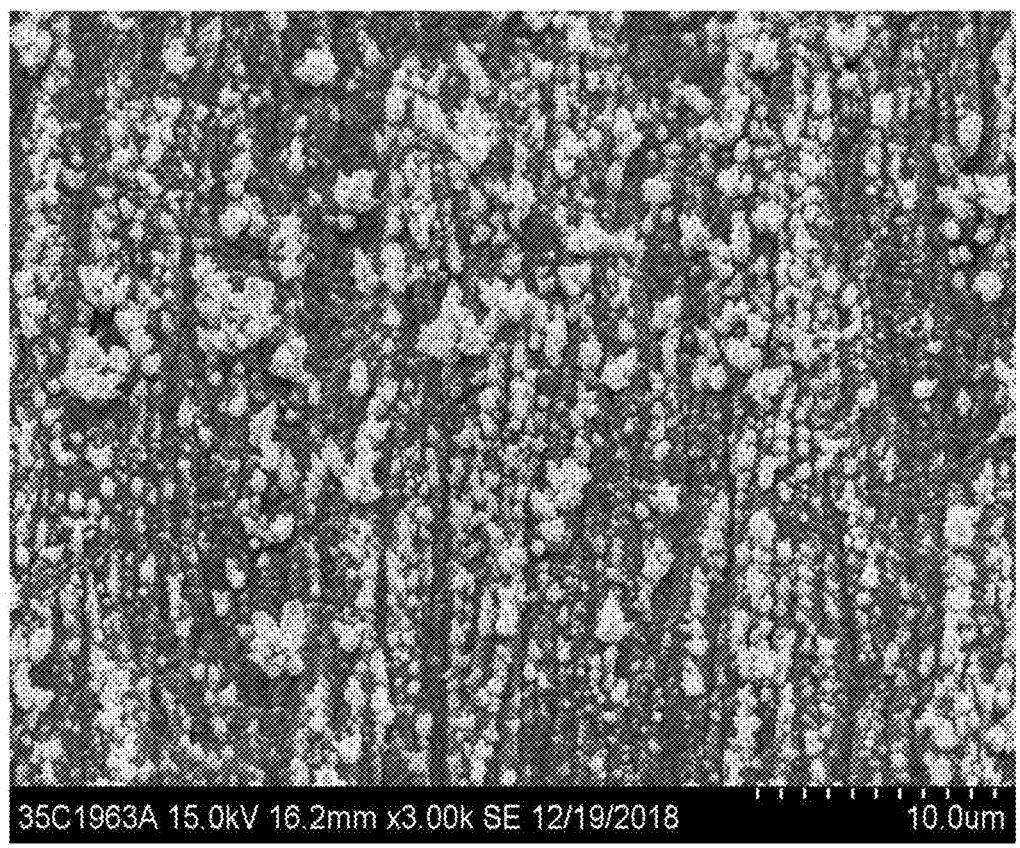
FIG. 14 is a scanning electron microscope image taken with a +35 degree tilt and under 3,000× magnification, which shows still another surface profile of the advanced reverse treated electrodeposited copper foil of the present disclosure.
Figure 15:
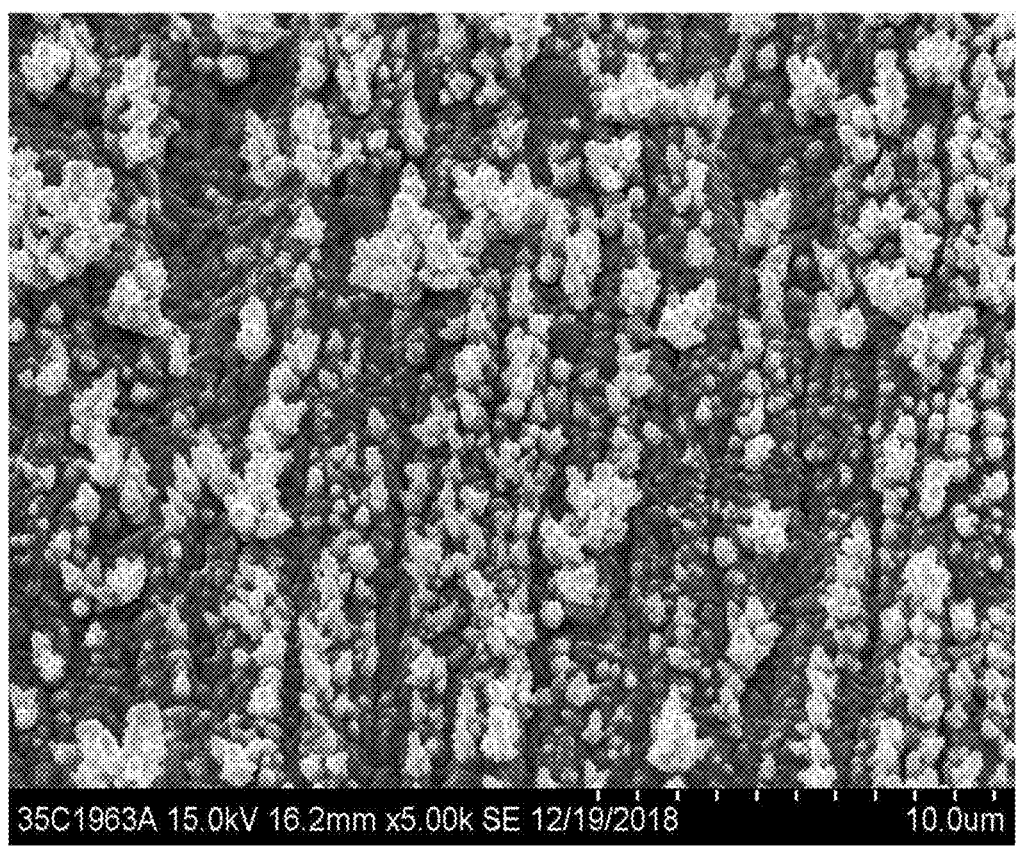
FIG. 15 is a scanning electron microscope image taken with a +35 degree tilt and under 5,000× magnification, which shows still another surface profile of the advanced reverse treated electrodeposited copper foil of the present disclosure.
Figure 16:
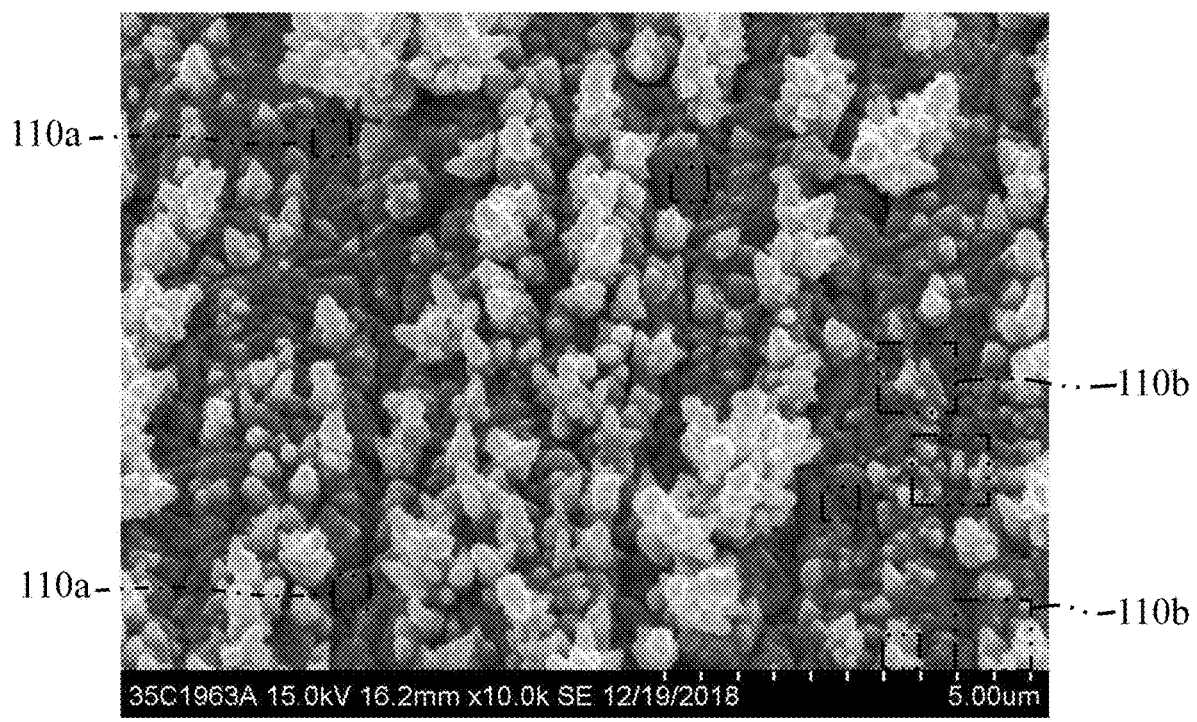
FIG. 16 is a scanning electron microscope image taken with a +35 degree tilt and under 10,000× magnification, which shows still another surface profile of the advanced reverse treated electrodeposited copper foil of the present disclosure.
Figure 24:
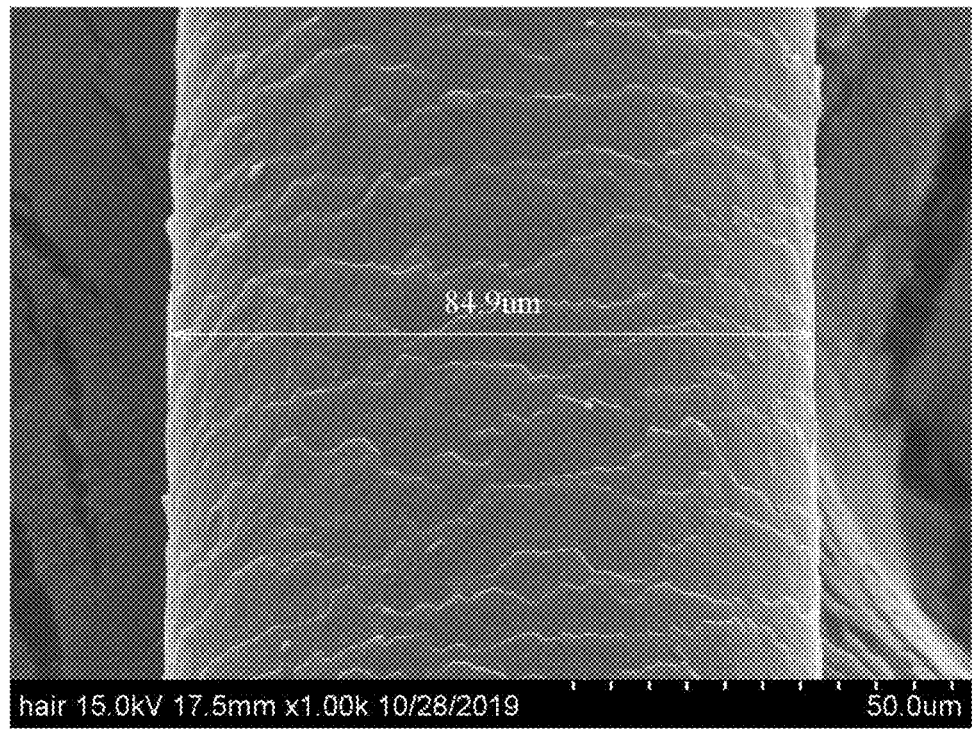
FIG. 24 is a scanning electron microscope image taken with a +35 degree tilt and under 1,000× magnification, which shows a pattern of human hair.

Referring to FIG. 5, FIG. 9 and FIG. 13, together with FIG. 24, images of the micro-roughened surface 110 taken by a scanning electron microscope (S-3400N, manufactured by Hitachi, Ltd.) with a +35 degree tilt and under 1,000× magnification are shown. It is observed that the copper crystals 111, the copper whiskers W and the copper crystal groups G form into an uneven and non-uniformly distributed horizontal or vertical stripe pattern that is similar to a pattern of human hair. Referring to FIG. 8, FIG. 12 and FIG. 16, images of the micro-roughened surface 110 taken by a scanning electron microscope (S-3400N, manufactured by Hitachi, Ltd.) with a +35 degree tilt and under 10,000× magnification are shown. It is observed that the micro-roughened surface 110 has at least two smooth areas 110a each having a length of 500 nm and a width of 500 nm and at least one rough area 110b having a length of 1,000 nm and a width of 1,000 nm. In each of the smooth areas 110a there are no copper crystals 111, copper whiskers W and/or copper crystal groups G In the at least one rough area 110b there are at least six of the copper crystals 111, the copper whiskers W and/or the copper crystal groups G The number of the topmost copper crystal 111 of the at least one rough area 110b is at least 10% of the total number of the topmost copper crystal of the micro-roughened surface 110. In addition, in each of the copper crystal groups G, the copper whiskers W respectively extend toward different directions to form a branch structure.

FIG. 8 shows that the micro-roughened surface 110 of the advanced reverse treated electrodeposited copper foil 11 at least has seven smooth areas 110a and three rough areas 110b. FIG. 12 shows that the micro-roughened surface 110 of the advanced reverse treated electrodeposited copper foil 11 at least has three smooth areas 110a and four rough areas 110b. FIG. 16 shows that the micro-roughened surface 110 of the advanced reverse treated electrodeposited copper foil 11 at least has five smooth areas 110a and three rough areas 110b.

Reference is again made to FIG. 2, in which the micro-roughened surface 110 further includes a plurality of peaks 112 and a plurality of grooves 113 among the peaks 112. The copper crystals 111, the copper whiskers W and the copper crystal groups G are correspondingly formed on the peaks 112. It is worth mentioning that each of the grooves 113 has a U-shaped or V-shaped cross-sectional profile, and a plurality of filling spaces 114 are located among the copper crystals 111, the copper whiskers W and the copper crystal groups G.

Accordingly, when a resin-based composite material is pressed on the advanced reverse treated electrodeposited copper foil 11 of the present disclosure, the micro-roughened surface 110 can receive a greater amount of a resin material so as to increase the bonding strength of the copper foil relative to a resulting substrate. In certain embodiments, the average depth of the grooves 113 can be less than 1.5 µm, preferably less than 1.3 µm, and more preferably less than 1 µm. The average width of the grooves 113 can be between 0.1 µm and 4 µm, and preferably between 0.6 µm and 3.8 µm.

Figure 3:
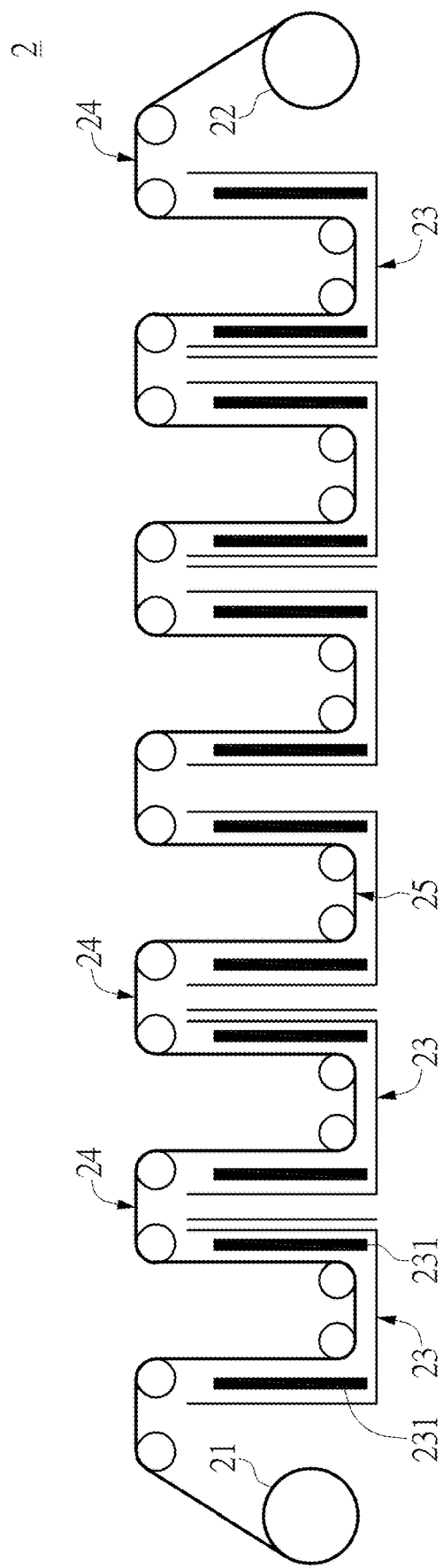
FIG. 3 is a schematic view of a continuous-type electrodepositing apparatus for producing the advanced reverse treated electrodeposited copper foil of the present disclosure.

Reference is again made to FIG. 1 together with FIG. 3. The advanced reverse treated electrodeposited copper foil 11 of the present disclosure can be obtained by performing a copper-electrodepositing micro-roughening treatment on a shiny side of a raw copper foil, in which the shiny side is formed into the micro-roughened surface 110. The copper-electrodepositing micro-roughening treatment is preferably performed by a continuous-type electrodepositing apparatus that uses a production speed of 5-20 m/min, a production temperature of 20-60° C. and a predetermined current density. However, these are merely exemplary details, and are not intended to limit the scope of the present disclosure. In certain embodiments, the copper-electrodepositing micro-roughening treatment can be performed to form a matte side of a raw copper foil into the micro-roughened surface 110. In addition, the copper-electrodepositing micro-roughening treatment can be performed by a batch-type electrodepositing apparatus.

As shown in FIG. 3, the continuous-type electrodepositing apparatus 2 includes a feeding roller 21, a receiving roller 22, a plurality of electrolytic tanks 23, a plurality of electrolytic roller assemblies 24 and a plurality of auxiliary roller assemblies 25. The electrolytic tanks 23 are arranged between the feeding roller 21 and the receiving roller 22 to contain copper-containing plating solutions having the same or different compositions. Each of the electrolytic tanks 23 has a pair of electrodes 231 (e.g., platinum electrodes) arranged therein. The electrolytic roller assemblies 24 are respectively arranged above the electrolytic tanks 23. The auxiliary roller assemblies 25 are respectively arranged in the electrolytic tanks 23. The electrolytic roller assemblies 24 and the auxiliary roller assemblies 25 can drive a raw copper foil to sequentially pass through the plating solutions within the electrolytic tanks 23. The electrodes 231 in each of the electrolytic tanks 23 and the corresponding electrolytic roller assemblies 24 are electrically connected to an external power source (not shown) for electrolyzing the corresponding plating solution, so as to allow the raw copper foil to have a desired effect.

The copper-containing plating solutions for the copper-electrodepositing micro-roughening treatment can contain a copper ion source, at least one metal additive and at least one non-metal additive. Specific examples of the copper ion source include copper sulfate and copper nitrate. Specific examples of the metal additive include cobalt, iron, zinc, and oxides and salts thereof. Specific examples of the non-metal additive include gelatin, organic nitrides, hydroxyethyl cellulose (HEC), polyethylene glycol (PEG), sodium 3-mercaptopropane sulphonate (MPS), Bis-(sodium sulfopropyl)-disulfide (SPS), and thiourea-containing compounds. However, these are merely exemplary details, and are not intended to limit the scope of the present disclosure.

In certain embodiments, the copper-electrodepositing micro-roughening treatment is divided into first and second stages, which respectively use two different copper-containing plating solutions (i.e., first and second copper-containing plating solutions). More specifically, the first stage applies a current density of 25-40 A/dm$^2$ to the first copper-containing plating solution having a copper ion concentration of 10-30 g/l, an acid concentration of 70-100 g/l, and a metal additive concentration of 150-300 mg/l. The second stage applies a current density of 30-56 A/dm$^2$ to the second copper-containing plating solution having a copper ion concentration of 70-100 g/l, an acid concentration of 30-60 g/l, and a metal additive concentration of 15-100 mg/l.

It should be noted that, the copper-electrodepositing micro-roughening treatment can be used to produce not only a reverse treated copper foil, but also a high temperature elongation (HTE) copper foil or a very low profile (VLP) copper foil.

Figure 4:
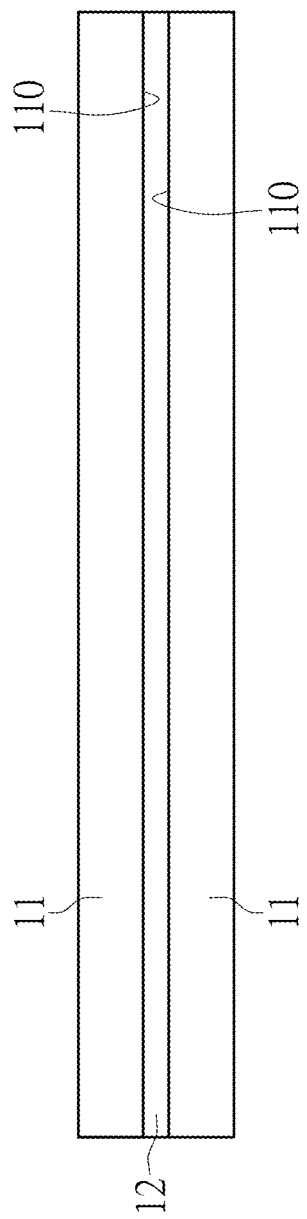
FIG. 4 is a schematic view of a copper clad laminate of the present disclosure.

Referring to FIG. 4, the present disclosure further provides a copper clad laminate 1 that includes a substrate 12 and two advanced reverse treated electrodeposited copper foils 11 disposed on the substrate 12. Two micro-roughened surfaces 110 of the two advanced reverse treated electrodeposited copper foils 11 are respectively bonded to two opposite surfaces (not numbered) of the substrate. In an unillustrated embodiment, the copper clad laminate 1 can include only one advanced reverse treated electrodeposited copper foil 11 disposed on the substrate 12. A micro-roughened surface 110 of the only one advanced reverse treated electrodeposited copper foil 11 is bonded to a surface of the substrate.

More specifically, the substrate 12 preferably has low dissipation factor (Df). The Df of the substrate 12 is less than or equal to 0.015 at 10 GHz, preferably less than or equal to 0.010, and more preferably less than or equal to 0.005. The substrate 12 can be made of a resin-based composite material (i.e., a preperg) that is obtained by curing a base material impregnated with a synthetic resin. Specific examples of the base material include a phenolic cotton paper, a cotton paper, a resin fiber fabric, a resin fiber non-woven fabric, a glass board, a glass woven fabric and a glass non-woven fabric. Specific examples of the synthetic resin include an epoxy resin, a polyester resin, polyimide resin, cyanate ester resin, a bismaleimide triazine resin, a polyphenylene ether resin and a phenol resin. The synthetic resin can be formed into a single layer or multilayer structure. In certain embodiments, the substrate 12 may be made of an EM891, IT958G, IT150DA, 57040G, S7439G, MEGTRON 4, MEGTRON 6 or MEGTRON 7 material.

Figure 17:
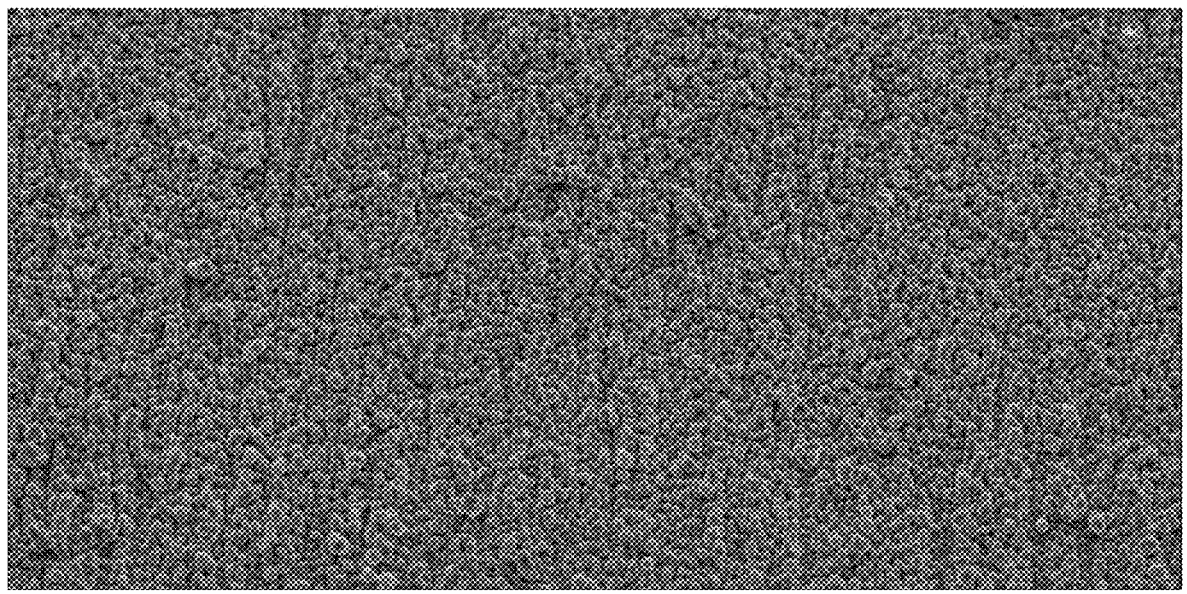
FIG. 17 is a scanning electron microscope image taken with a +35 degree tilt and under 1,000× magnification, which shows a surface profile of a reverse treated copper foil of the C company.
Figure 18:
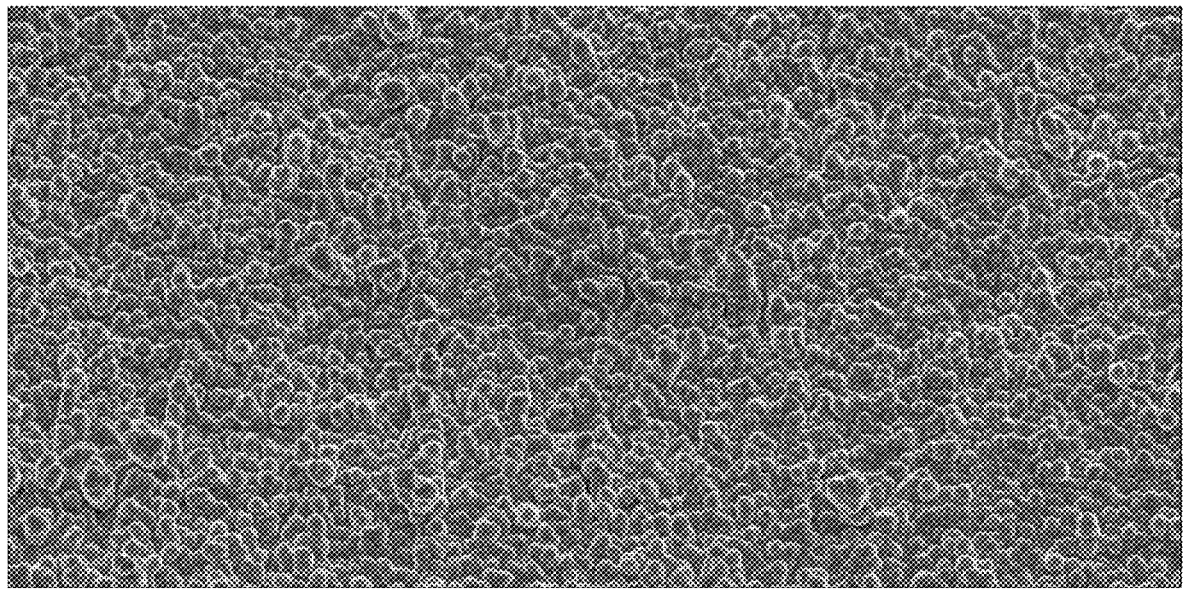
FIG. 18 is a scanning electron microscope image taken with a +35 degree tilt and under 1,000× magnification, which shows a surface profile of a reverse treated copper foil of the F company.
Figure 19:
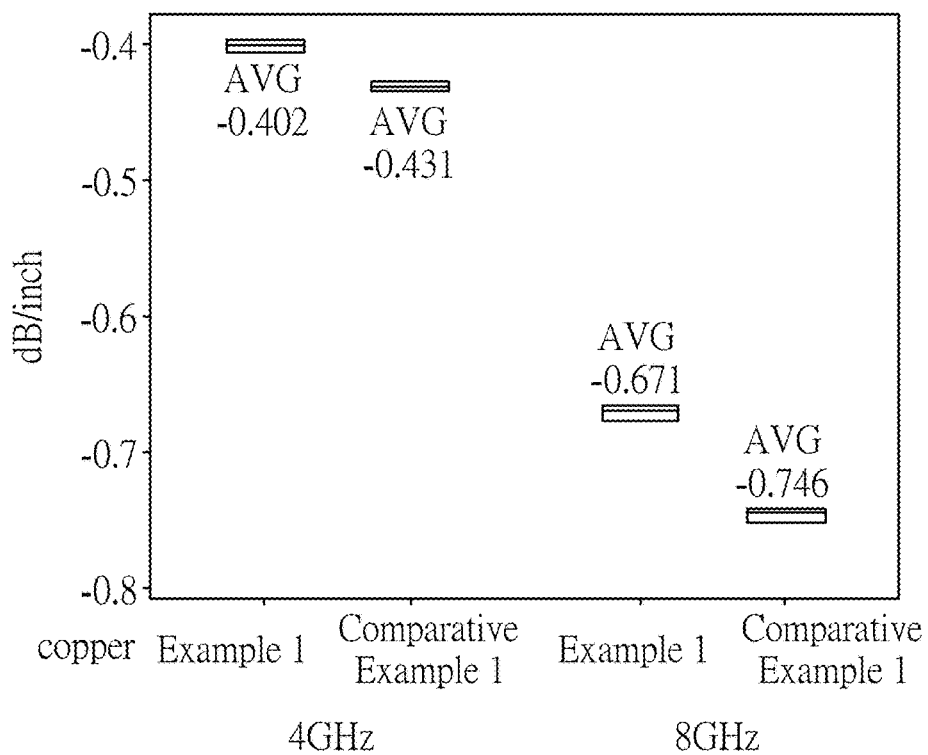
FIG. 19 is a graph illustrating the comparison of insertion loss between the printed circuit boards respectively according to the advanced reverse treated electrodeposited copper foil of the present disclosure and the conventional reverse treated copper foil.
Figure 20:
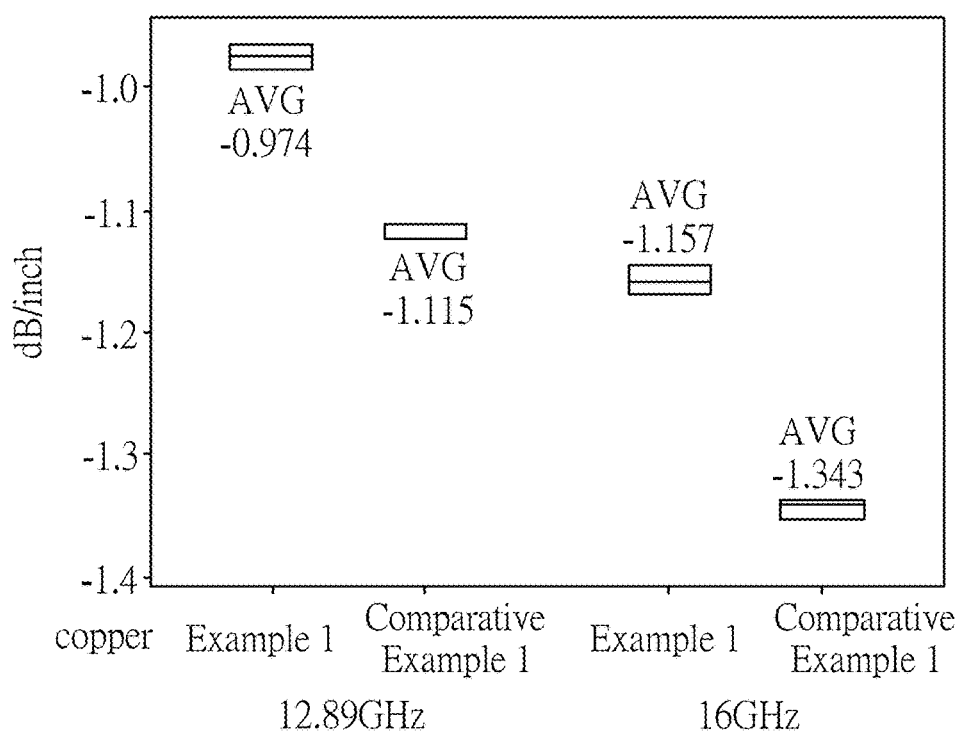
FIG. 20 is another graph illustrating the comparison of insertion loss between the printed circuit boards respectively according to the advanced reverse treated electrodeposited copper foil of the present disclosure and the conventional reverse treated copper foil.

Reference is now made to FIG. 19 and FIG. 20. FIG. 19 illustrates the insertion loss performances of 4 GHz and 8 GHz between the printed circuit boards of Example 1 and Comparative Example 1. FIG. 20 illustrates the insertion loss performances of 12.89 GHz and 16 GHz between the printed circuit boards of Example 1 and Comparative Example 1. The printed circuit board of Example 1 is manufactured from a plurality of advanced reverse treated electrodeposited copper foils (also called "RG311") and a plurality of substrates that are obtained by a printed circuit board manufacturing process. Each of the advanced reverse treated electrodeposited copper foils has a surface roughness Rz (JIS94) less than or equal to 2.3 μm. Each of the substrates is made of a low loss prepreg (product name: S7439G, prepared by the S company). The advanced reverse treated electrodeposited copper foils are produced by a copper-electrodepositing micro-roughening treatment having six stages, which can be implemented by the continuous-type electrodepositing apparatus 2 as shown in FIG. 3. The production conditions of the eleven stages are shown in Table 1. The surface profiles of the advanced reverse treated electrodeposited copper foils used in Example 1 are shown in FIG. 5 to FIG. 16, and the related technical details are as mentioned above.

manufacturing process. Each of the reverse treated copper foils has a surface roughness Rz (JIS94) less than or equal to 3.0 μm. Each of the substrates is made of a low loss prepreg (i.e., S7439G prepreg). The surface profile of the reverse treated copper foil used in Comparative Example 1 is shown in FIG. 17 and FIG. 18, in which the copper crystals are formed in a uniform distribution.

It is observed from FIG. 19 and FIG. 20 that, compared to the printed circuit board of Comparative Example 1, the insertion loss of the printed circuit board of Example 1 is reduced by 11.2% at 8 GHz and is reduced by 16.1% at 16 GHz. That is to say, the advanced reverse treated electrode-

TABLE 1

| | Production stage | 1<br>$1^{st}$ plating stage | 2<br>$2^{nd}$ plating stage | 3<br>$3^{rd}$ plating stage | 4<br>$4^{th}$ plating stage | 5<br>$5^{th}$ plating stage | 6<br>$6^{th}$ plating stage |
|---|---|---|---|---|---|---|---|
| Plating solution | Metal ion | $Cu^{2+}$ | $Cu^{2+}$ | $Cu^{2+}$ | $Cu^{2+}$ | $Cu^{2+}$ | $Cu^{2+}$ |
| | Metal concentration (g/L) | 5.0-10 | 66-80 | 66-80 | 5.0-10 | 5.0-10 | 66-80 |
| | Chlorine concentration (ppm) | <3 | <3 | <3 | <3 | <3 | <3 |
| | Acid concentration (g/L) | 90-100 (Sulfuric acid) | 60-75 (Sulfuric acid) | 60-75 (Sulfuric acid) | 90-100 (Sulfuric acid) | 90-100 (Sulfuric acid) | 60-75 (Sulfuric acid) |
| | Trace metal concentration (Ni, Pd, Ag, W . . .) (g/L) | 180-220 | 30-40 | 30-40 | 180-220 | 180-220 | 30-40 |
| | Time (Sec) | 1.5 | 2.25 | 1.5 | 1.5 | 2.25 | 2.25 |
| | Temperature (° C.) (±5° C.) | 30 | 45 | 45 | 30 | 30 | 45 |
| | PH | <1.5 | <1.5 | <1.5 | <1.5 | <1.5 | <1.5 |
| Example 1 | Current density | 24.07 | 24.69 | 0.01 | 31.48 | 4.63 | 1.23 |

| | Production stage | 7<br>$7^{th}$ plating stage | 8<br>$1^{st}$ trace metal plating stage | 9<br>$2^{nd}$ trace metal plating stage | 10<br>$3^{rd}$ trace metal plating stage | 11<br>Silane treating stage |
|---|---|---|---|---|---|---|
| Plating solution | Metal ion | $Cu^{2+}$ | $Ni^{2+}$ | $Zn^{2+}$ | $Cr^{6+}$ | NA |
| | Metal concentration (g/L) | 66-80 | 17-20 | 2-4 | 1-3 | 5-7 |
| | Chlorine concentration (ppm) | <3 | <3 | <3 | <3 | <3 |
| | Acid concentration (g/L) | 60-75 (Sulfuric acid) | 3-6 (Phosphoric acid) | 10-25 (Boric acid) | 0.1-2 (Phosphoric acid) | NA |
| | Trace metal concentration (Ni, Pd, Ag, W . . .) (g/L) | 30-40 | 100-200 | 100-200 | 100-200 | 100-200 |
| | Time (Sec) | 2.06 | 2.25 | 2.06 | 2.25 | 3 |
| | Temperature (° C.) (±5° C.) | 45 | 28 | 30 | 40 | 40 |
| | PH | <1.5 | 3-4 | 4-5 | 3-4 | 5-7 |
| Example 1 | Current density | 5.56 | 1.1 | 0.6 | 0.6 | NA |

The printed circuit board of Comparative Example 1 is manufactured from a plurality of reverse treated copper foils (product name: RTF 3, prepared by the C company) and a plurality of substrates obtained by a printed circuit board posited copper foil is capable of increasing signal integrity. Furthermore, the printed circuit board of Example 1 has a peel strength that is tested and meets the requirements for use.

TABLE 2

Insertion loss test by EM526 preperg with different copper foils

| Frequency (GHz) | Example 1 (RG311) Insertion Loss (−dB/in) | Comparative Example 2 (RTF-3) Insertion Loss (−dB/in) | Comparative Example 3 (FT1-UP) Insertion Loss (−dB/in) |
|---|---|---|---|
| 4 | −0.4 | −0.44 | −0.42 |
| 8 | −0.66 | −0.76 | −0.72 |
| 12.89 | −0.95 | −1.15 | −1.06 |

Test Conditions:
Test material: EMC526 preperg (i.e., low loss preperg) and RG311
 EMC526 preperg and RTF-3
 EMC526 preperg and FT1-UP
Test impedance: 85Ω (Differential)
Line length: 5/10 inch
PCB thickness: 77 mil

TABLE 3

Insertion loss improvement percentage of RG311 relative to RTF-3, according to EMC526 preperg

| Frequency (GHz) | Example 1 (RG311) | Comparative Example 2 (RTF-3) |
|---|---|---|
| 4 | 0.0% | 9.1% |
| 8 | 0.0% | 13.2% |
| 12.89 | 0.0% | 17.4% |

TABLE 4

Insertion loss improvement percentage of RG311 relative to FT1-UP, according to EMC526 preperg

| Frequency (GHz) | Example 1 (RG311) | Comparative Example 3 (FT1-UP) |
|---|---|---|
| 4 | 0.0% | 4.8% |
| 8 | 0.0% | 8.3% |
| 12.89 | 0.0% | 10.4% |

Figure 21:
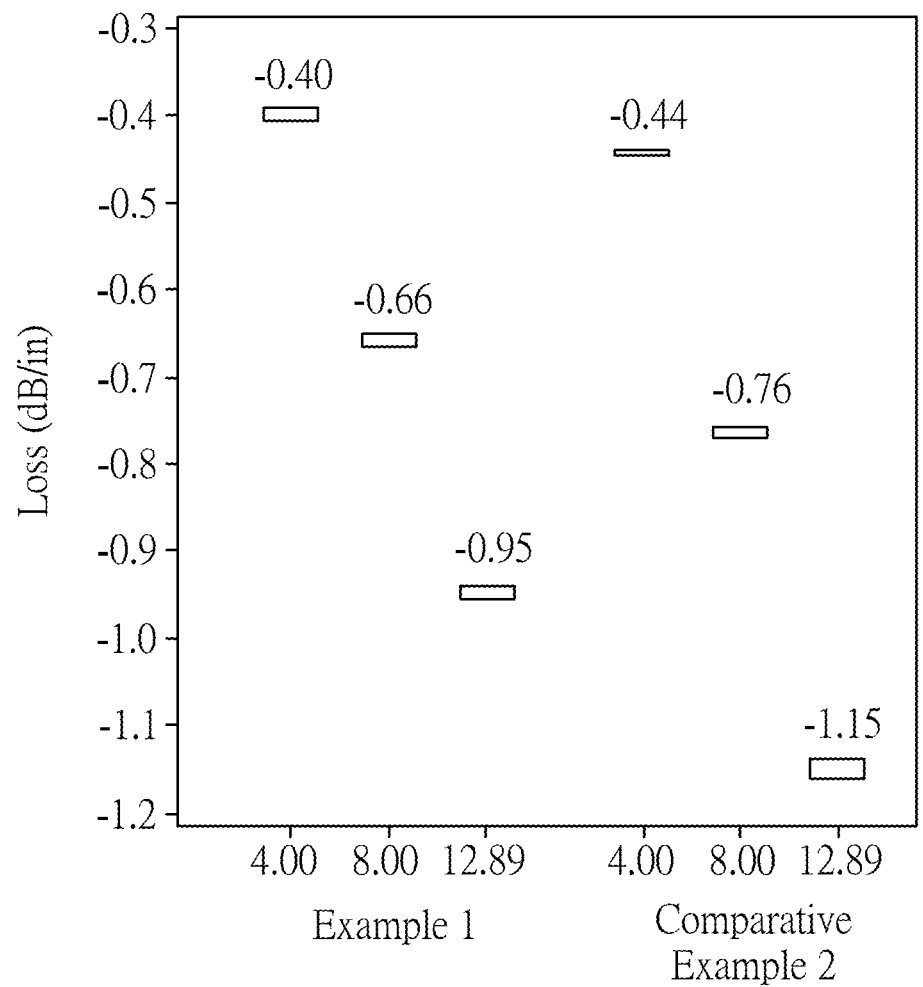
FIG. 21 is still another graph illustrating the comparison of insertion loss between the printed circuit boards respectively according to the advanced reverse treated electrodeposited copper foil of the present disclosure and the conventional reverse treated copper foil.

Referring to FIG. 21, which is to be read in conjunction with Table 2, the insertion loss performances of the printed circuit boards of Example 1 and Comparative Example 2 are shown. The printed circuit board of Comparative Example 2 is manufactured from a plurality of reverse treated copper foils (product name: RTF 3, prepared by the C company) and a plurality of substrates obtained by a printed circuit board manufacturing process. Each of the substrates is made of a low loss prepreg (i.e., EM526 prepreg). In the surface profile of the reverse treated copper foil used in Comparative Example 2, copper crystals are formed in a uniform distribution.

It is observed from FIG. 21 that, compared to the printed circuit board of Comparative Example 2, the insertion loss of the printed circuit board of Example 1 is reduced by 13.3% at 8 GHz (i.e., (−0.76−(−0.66))/−0.76=13.3%) and is reduced by 17.4% at 12.89 GHz (i.e., (−1.15−(−0.95))/(−1.15)=17.4%). It is observed from Table 2 and Table 3 that, the advanced reverse treated electrodeposited copper foil is capable of increasing signal integrity.

Figure 22:
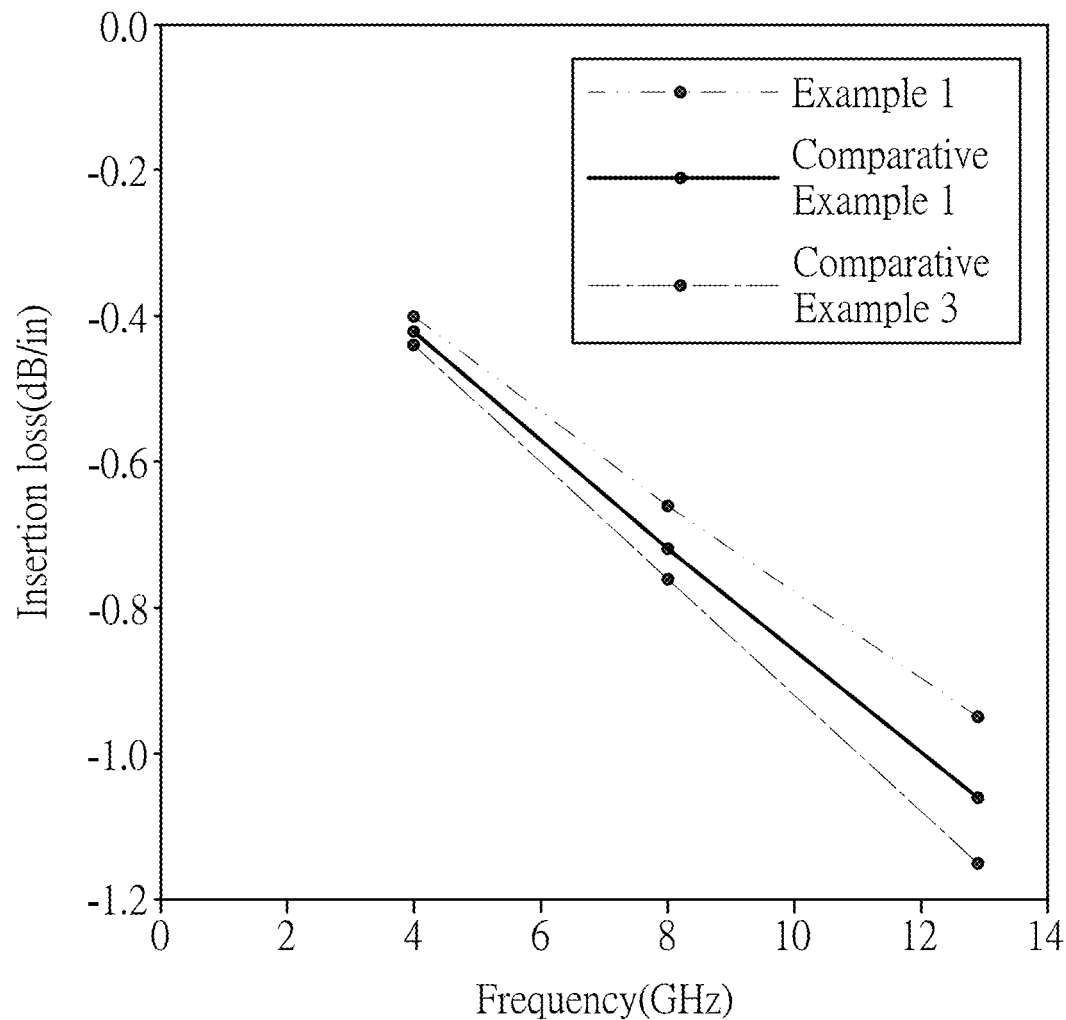
FIG. 22 is still another graph illustrating the comparison of insertion loss between the printed circuit boards respectively according to the advanced reverse treated electrodeposited copper foil of the present disclosure and the conventional reverse treated copper foil.
Figure 23:
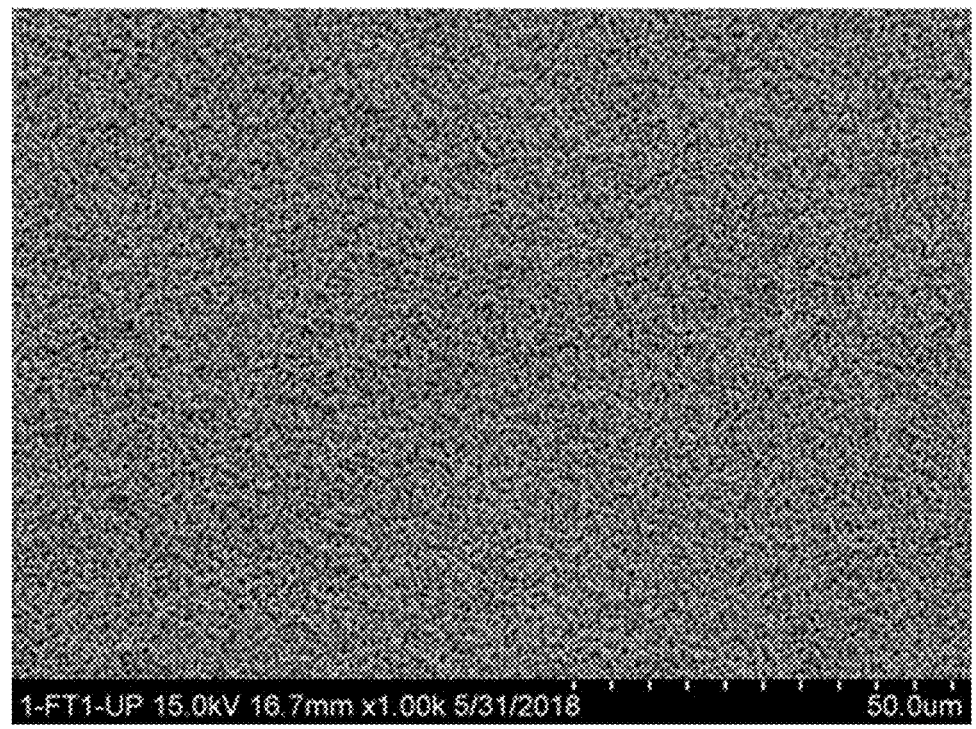
FIG. 23 is a scanning electron microscope image taken with a +35 degree tilt and under 1,000× magnification, which shows a surface profile of a HVLP copper foil of the F company.

Referring to FIG. 22, the insertion loss performances of the printed circuit boards of Example 1 and Comparative Examples 1 and 3 are shown. The printed circuit board of Comparative Example 3 is manufactured from a plurality of hyper very low profile (HVLP) copper foil (product name: FT1-UP, prepared by the F company) and a plurality of substrates obtained by a printed circuit board manufacturing process. Each of the HVLP copper foils has a surface roughness Rz (JIS94) less than or equal to 2.0 tim. Each of the substrates is made of a low loss prepreg (i.e., EM526 prepreg).

It is observed from FIG. 22, Table 2 and Table 4 that, compared to the printed circuit boards of Comparative Examples 1 and 3, the insertion loss of the printed circuit board of Example 1 is reduced by 8.4% at 8 GHz and is reduced by 10.4% at 12.89 GHz. That is to say, the advanced reverse treated electrodeposited copper foil is capable of increasing signal integrity.

In conclusion, the advanced reverse treated electrodeposited copper foil of the present disclosure has an apparent uneven surface profile resulted from a plurality of non-uniformly distributed copper crystals, a plurality of copper whiskers respectively formed by different numbers of the copper crystals and a plurality of copper crystal groups respectively formed by different numbers of the copper whiskers. Therefore, an increased signal integrity and a reduced insertion loss can be achieved, while maintaining good peel strength, to adapt to high frequency and high speed signal transmission so as to meet the requirements of 5G applications.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. An advanced reverse treated electrodeposited copper foil characterized in that said copper foil has an uneven micro-roughened surface that has a plurality of non-uniformly distributed copper crystals, wherein a number of the copper crystals are stacked together to form one of a plurality of copper whiskers, and a number of the copper whiskers are grouped together to form one of a plurality of copper crystal groups, and wherein the copper crystals, the copper whiskers and the copper crystal groups form into a non-uniformly distributed stripe pattern as observed from a scanning electron microscope image of the micro-roughened surface taken with a +35 degree tilt and under 1,000× magnification.

2. The advanced reverse treated electrodeposited copper foil according to claim 1, wherein the micro-roughened surface has at least two smooth areas each having a length of 500 nm and a width of 500 nm and at least one rough area having a length of 1,000 nm and a width of 1,000 nm, as observed from a scanning electron microscope image of the micro-roughened surface taken with a +35 degree tilt and under 10,000× magnification, and wherein no copper crystals, copper whiskers and/or copper crystal groups are in each of the smooth areas, and at least six of the copper crystals, the copper whiskers and/or the copper crystal groups are in the at least one rough area.

3. The advanced reverse treated electrodeposited copper foil according to claim 2, wherein each of the copper whiskers has a topmost copper crystal.

4. The advanced reverse treated electrodeposited copper foil according to claim 3, wherein the topmost copper crystals are each in a shape of a conoid, a rod or a sphere.

5. The advanced reverse treated electrodeposited copper foil according to claim 3, wherein the number of the topmost copper crystal of the at least one rough area is at least 10% of the total number of the topmost copper crystal, which is observed under 10,000× magnification.

6. The advanced reverse treated electrodeposited copper foil according to claim 1, wherein a surface roughness Rz (JIS94) of the micro-roughened surface is less than 2.3 μm.

7. The advanced reverse treated electrodeposited copper foil according to claim 1, wherein the micro-roughened surface includes a plurality of peaks and a plurality of grooves among the peaks, and the copper crystals, the copper whiskers and the copper crystal groups are correspondingly formed on the peaks.

8. The advanced reverse treated electrodeposited copper foil according to claim 7, wherein each of the grooves has a U-shaped or V-shaped cross-sectional profile.

9. A copper clad laminate, comprising:
a substrate; and
an advanced reverse treated electrodeposited copper foil disposed on the substrate and having an uneven micro-roughened surface that is attached to a surface of the substrate, wherein the micro-roughened surface has a plurality of non-uniformly distributed copper crystals;
wherein a number of the copper crystals are stacked together to form one of a plurality of copper whiskers, and a number of the copper whiskers are grouped together to form one of a plurality of copper crystal groups;
wherein the copper crystals, the copper whiskers and the copper crystal groups form into a non-uniformly distributed stripe pattern that is observed from a scanning electron microscope image of the micro-roughened surface taken with a +35 degree tilt and under 1,000× magnification.

10. The copper clad laminate according to claim 9, wherein the micro-roughened surface has at least two smooth areas each having a length of 500 nm and a width of 500 nm and at least one rough area having a length of 1,000 nm and a width of 1,000 nm, which are observed from a scanning electron microscope image of the micro-roughened surface taken with a +35 degree tilt and under 10,000× magnification, and wherein in each of the smooth areas there are no copper crystals, copper whiskers and/or copper crystal groups, and in the at least one rough area there are at least six of the copper crystals, the copper whiskers and/or the copper crystal groups.

11. The copper clad laminate according to claim 10, wherein each of the copper whiskers has a topmost copper crystal.

12. The copper clad laminate according to claim 11, wherein the topmost copper crystals are each in the shape of a conoid, a rod or a sphere.

13. The copper clad laminate according to claim 11, wherein the number of the topmost copper crystal of the at least one rough area is at least 10% of the total number of the topmost copper crystal, which is observed under 10,000× magnification.

14. The copper clad laminate according to claim 9, wherein the surface roughness Rz (JIS94) of the micro-roughened surface is less than 2.3 μm.

15. The copper clad laminate according to claim 9, wherein the micro-roughened surface includes a plurality of peaks and a plurality of grooves among the peaks, and the copper crystals, the copper whiskers and the copper crystal groups are correspondingly formed on the peaks.

16. The copper clad laminate according to claim 15, wherein each of the grooves has a U-shaped or V-shaped cross-sectional profile.

17. The copper clad laminate according to claim 9, wherein the substrate is made of a low loss prepreg, and the copper clad laminate has an insertion loss between −0.36 dB/in and −0.44 dB/in at 4 GHz, which is measured by a stripline and in accordance with the Delta-L standard.

18. The copper clad laminate according to claim 9, wherein the substrate is made of a low loss prepreg, and the copper clad laminate has an insertion loss between −0.59 dB/in and −0.72 dB/in at 8 GHz, which is measured by a stripline and in accordance with the Delta-L standard.

19. The copper clad laminate according to claim 9, wherein the substrate is made of a low loss prepreg, and the copper clad laminate has an insertion loss between −0.85 dB/in and −1.05 dB/in at 12.89 GHz, which is measured by a stripline and in accordance with the Delta-L standard.

* * * * *